United States Patent
Kang

(10) Patent No.: US 10,903,448 B2
(45) Date of Patent: *Jan. 26, 2021

(54) ORGANIC LIGHT-EMITTING DISPLAY APPARATUS AND METHOD OF MANUFACTURING THE SAME

(71) Applicant: Samsung Display Co., Ltd., Yongin-Si (KR)

(72) Inventor: Tae-Wook Kang, Yongin (KR)

(73) Assignee: Samsung Display Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 16/821,901

(22) Filed: Mar. 17, 2020

(65) Prior Publication Data

US 2020/0220102 A1 Jul. 9, 2020

Related U.S. Application Data

(63) Continuation of application No. 16/112,579, filed on Aug. 24, 2018, now Pat. No. 10,622,586, which is a
(Continued)

(30) Foreign Application Priority Data

Jul. 12, 2013 (KR) .................. 10-2013-0082439

(51) Int. Cl.
*H01L 51/52* (2006.01)
*H01L 51/56* (2006.01)
(Continued)

(52) U.S. Cl.
CPC ...... *H01L 51/5253* (2013.01); *H01L 27/3246* (2013.01); *H01L 27/3258* (2013.01);
(Continued)

(58) Field of Classification Search
CPC ... H01L 51/52; H01L 51/525; H01L 51/5253; H01L 51/5256; H01L 51/50; H01L 51/56;
(Continued)

(56) References Cited

U.S. PATENT DOCUMENTS 6,429,584 B2 8/2002 Kubota
6,836,070 B2 12/2004 Chung et al.
(Continued)

FOREIGN PATENT DOCUMENTS

CN 1702532 A 11/2005
CN 1825616 A 8/2006
(Continued)

OTHER PUBLICATIONS

Taiwanese Office Action Report, Application No. 103115141 dated Nov. 29, 2019, 6 pages.
(Continued)

*Primary Examiner* — Chuong A Luu
(74) *Attorney, Agent, or Firm* — Innovation Counsel LLP

(57) ABSTRACT

An organic light-emitting display apparatus is provided. The display apparatus includes a pixel-defining layer disposed on a substrate, wherein the pixel-defining layer defines an emission region and a non-emission region, an organic light-emitting device disposed in the emission region, and a protruding portion disposed on a portion of the pixel-defining layer in the non-emission region. The display apparatus also includes a thin film encapsulating layer disposed on the substrate for sealing the organic light-emitting device and the protruding portion, the thin film encapsulating layer comprising at least one organic film and at least one inorganic film, wherein at least one organic film corresponds to a functional organic film, and a height of a first upper surface of the functional organic film disposed away from the protruding portion is lower than a height of
(Continued)

a second upper surface of the functional organic film disposed near a top of the protruding portion.

18 Claims, 6 Drawing Sheets

Related U.S. Application Data continuation of application No. 15/454,938, filed on Mar. 9, 2017, now Pat. No. 10,084,154, which is a continuation of application No. 14/083,873, filed on Nov. 19, 2013, now Pat. No. 9,614,180.

(51) Int. Cl.
    H01L 27/32    (2006.01)
    H01L 27/12    (2006.01)
(52) U.S. Cl.
    CPC ........ H01L 27/3262 (2013.01); H01L 51/525 (2013.01); H01L 51/5256 (2013.01); H01L 51/56 (2013.01); H01L 27/1248 (2013.01); H01L 2227/323 (2013.01); H01L 2251/301 (2013.01); H01L 2251/558 (2013.01)
(58) Field of Classification Search
    CPC . H01L 51/5234; H01L 51/5237; H01L 27/32; H01L 27/3274; H01L 27/3297; H01L 27/3258; H01L 27/3262; H01L 27/3246; H01L 27/1248; H01L 2251/50; H01L 2251/568; H01L 2251/5376; H01L 2251/558; H01L 2251/323; H01L 2251/301
    USPC .......................................................... 257/40
    See application file for complete search history.

(56) References Cited

U.S. PATENT DOCUMENTS

| | | | |
|---|---|---|---|
| 7,453,094 | B2 | 11/2008 | Takayama |
| 7,554,118 | B2 | 6/2009 | Kim et al. |
| 8,049,409 | B2 | 11/2011 | Suh |
| 8,237,355 | B2 | 8/2012 | Yamazaki |
| 8,507,897 | B2 | 8/2013 | Yanagihara |
| 8,759,822 | B2 | 6/2014 | Lee |
| 8,835,205 | B2 | 9/2014 | Park |
| 8,969,904 | B2 | 3/2015 | Chao et al. |
| 8,975,636 | B2 | 3/2015 | Kim et al. |
| 9,076,745 | B2 | 7/2015 | Choi et al. |
| 9,614,180 | B2 | 4/2017 | Kang |
| 10,622,586 | B2 * | 4/2020 | Kang ................. H01L 27/3262 |
| 2001/0054867 | A1 | 12/2001 | Kubota |
| 2003/0017297 | A1 | 1/2003 | Song |
| 2003/0030369 | A1 | 2/2003 | Shih |
| 2003/0127973 | A1 | 7/2003 | Weaver et al. |
| 2004/0135501 | A1 | 7/2004 | Nishikawa |
| 2004/0152390 | A1 | 8/2004 | Chung et al. |
| 2007/0159089 | A1 | 7/2007 | Oh |
| 2008/0018229 | A1 | 1/2008 | Yamazaki |
| 2008/0030128 | A1 | 2/2008 | Kim |
| 2010/0019654 | A1 | 1/2010 | Hayashi |
| 2010/0171106 | A1 | 7/2010 | Jung et al. |
| 2010/0171138 | A1 | 7/2010 | Yamazaki et al. |
| 2011/0062444 | A1 | 3/2011 | Park et al. |
| 2011/0221334 | A1 | 9/2011 | Kwon et al. |
| 2013/0153939 | A1 | 6/2013 | Lee et al. |
| 2013/0221341 | A1 | 8/2013 | Iwabuchi |
| 2013/0248867 | A1 | 9/2013 | Kim |
| 2013/0328480 | A1 | 12/2013 | Joo |
| 2015/0179967 | A1 | 6/2015 | Hashimoto |

FOREIGN PATENT DOCUMENTS

| | | |
|---|---|---|
| CN | 101359679 A | 2/2009 |
| CN | 102969456 A | 3/2013 |
| CN | 104282713 B | 1/2015 |
| JP | 2001-284041 A | 10/2001 |
| JP | 2011-103222 A | 5/2011 |
| JP | 2011-154797 A | 8/2011 |
| JP | 2012-190612 A | 10/2012 |
| KR | 10-2004-0042855 A | 5/2004 |
| KR | 10-2010-0011900 A | 2/2010 |
| KR | 10-2011-0094460 A | 8/2011 |
| KR | 10-2012-0031382 A | 4/2012 |
| KR | 10-2080008 B1 | 2/2020 |
| TW | 519853 B | 2/2003 |
| TW | 201310635 A1 | 3/2013 |
| TW | 201327801 A1 | 7/2013 |

OTHER PUBLICATIONS

Chinese Office Action corresponding to Chinese Patent Application No. 201410171602.3 dated Nov. 15, 2018 7 pages.

* cited by examiner

ORGANIC LIGHT-EMITTING DISPLAY APPARATUS AND METHOD OF MANUFACTURING THE SAME

CROSS-REFERENCE TO RELATED APPLICATION(S)

This application is a continuation application of U.S. patent application Ser. No. 16/112,579 filed on Aug. 24, 2018, which is a continuation application of U.S. patent application Ser. No. 15/454,938 filed on Mar. 9, 2017 (now U.S. Pat. No. 10,084,154), which is a continuation application of U.S. patent application Ser. No. 14/083,873 filed on Nov. 19, 2013 (now U.S. Pat. No. 9,614,180), which claims the benefit of Korean Patent Application No. 10-2013-0082439 filed on Jul. 12, 2013, the entire contents of which are incorporated herein by reference.

BACKGROUND

1. Technical Field

The present disclosure relates to an organic light-emitting display apparatus and a method of manufacturing the organic light-emitting display apparatus.

2. Description of the Related Art

An organic light-emitting display apparatus includes an organic light-emitting device (OLED). The OLED typically includes a hole-injecting electrode, an electron-injecting electrode, and an organic emission layer disposed between the electrodes. The organic light-emitting display apparatus is a self-emissive display device that generates light when excitons (which are generated when holes from the hole-injecting electrode and electrons from the electron-injecting electrode combine in the organic emission layer) drop from an excitation state to a ground state.

Being a self-emissive display device, the organic light-emitting display apparatus does not need an additional light source, may be driven using a low voltage, and may be configured having a thin and lightweight design. Additionally, the organic light-emitting display apparatus possesses superior characteristics such as wide viewing angles, high contrast, and rapid response times. As a result of their superior characteristics, the organic light-emitting display apparatus has been identified as next-generation display apparatuses.

In a conventional organic light-emitting display apparatus, an encapsulating layer comprising an organic film may be formed sealing a protruding portion disposed on a pixel-defining layer. However, the organic film used in the conventional light-emitting display apparatus typically has low viscosity and may expose the top of the protruding portions when the organic film spreads. To ensure that the protruding portions are covered/sealed in the conventional light-emitting display apparatus, the thickness of the thin film encapsulating layer may need to be increased. Accordingly, this may result in an increase in the thickness of the conventional organic light-emitting display apparatus (i.e., thicker form factor). Furthermore, processing time and cost of the organic film material may also increase.

SUMMARY

The present disclosure is directed to address at least the above problems relating to the encapsulation of organic light-emitting devices (OLEDs) having protruding portions on a pixel-defining layer.

According to some embodiments of the inventive concept, an organic light-emitting display apparatus is provided. The organic light-emitting display apparatus includes a pixel-defining layer disposed on a substrate, wherein the pixel-defining layer defines an emission region and a non-emission region; an organic light-emitting device disposed in the emission region; a protruding portion disposed on a portion of the pixel-defining layer in the non-emission region; and a thin film encapsulating layer disposed on the substrate for sealing the organic light-emitting device and the protruding portion, the thin film encapsulating layer comprising at least one organic film and at least one inorganic film, wherein at least one organic film corresponds to a functional organic film, and a height of a first upper surface of the functional organic film disposed away from the protruding portion is lower than a height of a second upper surface of the functional organic film disposed near a top of the protruding portion.

In some embodiments, the functional organic film may have a first thickness near the top of the protruding portion, and the first thickness may have a value that is equal to or greater than about 100 Å.

In some embodiments, the first thickness may be less than or equal to a thickness of a planarized portion of the functional organic film near the top of the protruding portion.

In some embodiments, the top of the protruding portion may be disposed above the first upper surface of the functional organic film.

In some embodiments, the protruding portion may correspond to a spacer disposed in the non-emission region.

In some embodiments, the functional organic film may include a photo-initiator.

In some embodiments, the functional organic film may include a material having a viscosity that is adjustable using light or temperature.

In some embodiments, the organic light-emitting display apparatus may further include a protective layer interposed between the organic light-emitting device and the thin film encapsulating layer.

In some embodiments, the protruding portion may include foreign material.

In some embodiments, an uppermost layer of the thin film encapsulating layer may be exposed, and the uppermost layer may include an inorganic film.

In some embodiments, an uppermost layer of the thin film encapsulating layer may be exposed, and the uppermost layer may include an organic film.

In some embodiments, the organic light-emitting display apparatus may further include a plurality of functional organic films, wherein the functional organic films have different thicknesses near the top of the protruding portion.

According to some other embodiments of the inventive concept, a method of manufacturing an organic light-emitting display apparatus is provided. The method includes forming a pixel-defining layer on a substrate, wherein the pixel-defining layer defines an emission region and a non-emission region; forming an organic light-emitting device in the emission region; forming a protruding portion on a portion of the pixel-defining layer in the non-emission region; and forming a thin film encapsulating layer on the substrate for sealing the organic light-emitting device and the protruding portion, the thin film encapsulating layer comprising at least one organic film and at least one inorganic film, wherein at least one organic film corresponds to a functional organic film, and a height of a first upper surface of the functional organic film disposed away from the protruding portion is lower than a height of a second upper surface of the functional organic film disposed near a top of the protruding portion.

In some embodiments, the method may further include forming the functional organic film by depositing or coating a liquid pre-functional organic film, and adjusting a viscosity of the liquid pre-functional organic film.

In some embodiments, adjusting the viscosity of the liquid pre-functional organic film may include adjusting the viscosity by adjusting a temperature of the substrate or by irradiating light onto the liquid pre-functional organic film.

In some embodiments, the method may include forming the protruding portion and the pixel-defining layer using a half-tone mask process.

In some embodiments, the functional organic film may include a photo-initiator.

In some embodiments, the method may include forming the organic film using flash evaporation or inkjet printing.

DETAILED DESCRIPTION

Figure 1:
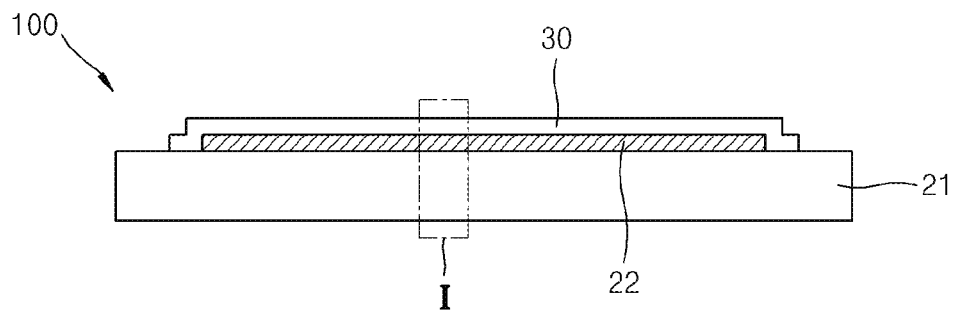
FIG. 1 is a cross-sectional view of an organic light-emitting display apparatus according to an embodiment of the inventive concept.

The inventive concept will be described more fully with reference to the accompanying drawings, in which different embodiments are shown. Like reference numerals in the drawings denote like elements, and thus a repeated description of those similar elements will be omitted. In the drawings, the lengths and sizes of elements may have been exaggerated for clarity and convenience of description.

It should be noted that the inventive concept may be embodied in many different forms and should not be construed as being limited to the disclosed embodiments. Also, it will be understood that when a layer is referred to as being "on" or "on the top of" another layer, the layer can be disposed directly on the other layer, or disposed on the other layer with one or more intervening layers being present.

The terminology used herein is for describing particular embodiments and is not intended to limit the inventive concept. As used herein, the singular forms "a", "an" and "the" are intended to include the plural forms as well, unless the context clearly indicates otherwise. It will be further understood that the terms "comprises," "comprising," "includes," and/or "including," when used herein, specify the presence of stated steps, operations, and/or elements, but do not preclude the presence or addition of one or more other steps, operations, and/or elements. It will be understood that, although the terms, 'first', 'second', etc. may be used herein to describe various elements, these elements should not be limited by these terms. These terms are only used to distinguish one element from another.

As used herein, the term "and/or" includes any and all combinations of one or more of the associated listed items. Expressions such as "at least one of," when preceding a list of elements, modify the entire list of elements and do not modify the individual elements of the list.

FIG. 1 is a cross-sectional view of an organic light-emitting display apparatus according to an embodiment.

Referring to FIG. 1, an organic light-emitting display apparatus 100 includes an organic emissive portion 22 disposed on a substrate 21 and a thin film encapsulating layer 30 for sealing the organic emissive portion 22.

The organic emissive portion 22 includes a plurality of organic light-emitting devices capable of emitting red, green, blue, or white light. The organic emissive portion 22 may display an image via the organic light-emitting devices.

The thin film encapsulating layer 30 may be formed of a transparent material which allows an observer to view the image from the organic emissive portion 22. The thin film encapsulating layer 30 may cover the upper and side surfaces of the organic emissive portion 22, thus preventing air and moisture from reaching the organic emissive portion 22.

Figure 2:
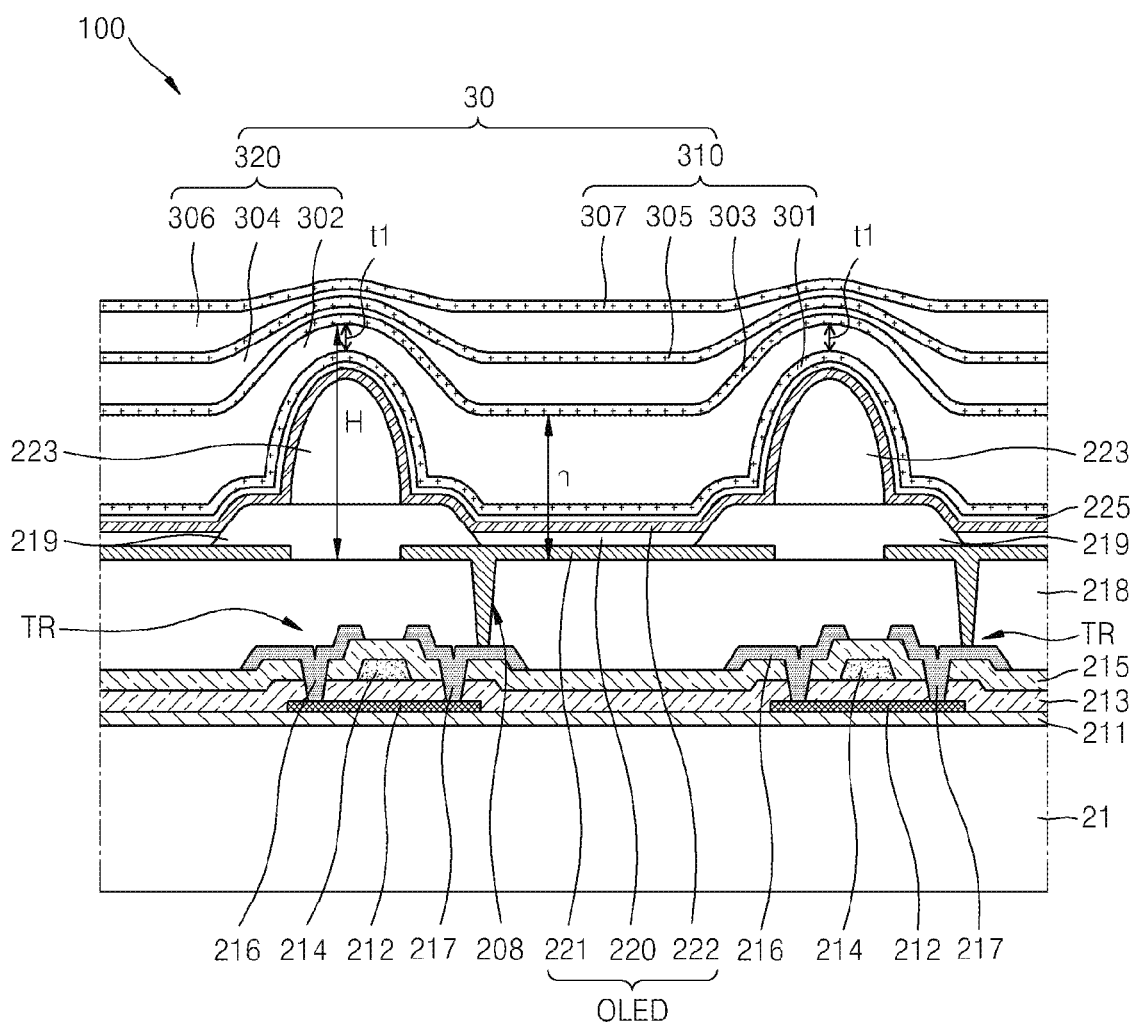
FIG. 2 is a magnified cross-sectional view of portion I of the organic light-emitting display apparatus in FIG. 1.

FIG. 2 is a magnified cross-sectional view of portion I of the organic light-emitting display apparatus 100 in FIG. 1.

Referring to FIG. 2, the organic light-emitting display apparatus 100 includes a substrate 21, a pixel-defining layer 219, an organic light-emitting device OLED, a protruding portion 223, and a thin film encapsulating layer 30. The organic light-emitting display apparatus 100 may further include a buffer film 211, a thin film transistor (TFT) TR, and a protective layer 225.

The substrate 21 may be formed of a transparent glass material (e.g., having silicon dioxide ($SiO_2$) as a main component). However, the substrate 21 is not limited to transparent glass materials. In some embodiments, the substrate 21 may be formed of other materials such as ceramic, transparent plastic, or metal. In some further embodiments, the substrate 21 may be a flexible substrate that is bendable.

The buffer film 211 acts as a barrier layer, and prevents impurity ions in the substrate 21 from diffusing to layers disposed on the top surface of the substrate 21. The buffer film 211 also protects the substrate 21 from air and moisture in the ambient environment. Additionally, the buffer film 211 provides a planar surface on which subsequent layers can be deposited. In some embodiments, the buffer film 211 may be formed of an inorganic material such as silicon oxide, silicon nitride, silicon oxynitride, aluminum oxide, aluminum nitride, titanium oxide, or titanium nitride. In other embodiments, the buffer film 211 may be formed of an organic material such as polyimide, polyester, or acryl, or a stack thereof. In some particular embodiments, the buffer film 211 may be omitted. The buffer film 211 may be formed using deposition methods such as plasma-enhanced chemical vapor deposition (PECVD), atmospheric pressure CVD (APCVD), or low pressure CVD (LPCVD).

The TFT TR includes an active layer 212, a gate electrode 214, a source electrode 216, and a drain electrode 217. As shown in FIG. 2, the gate electrode 214 and the active layer 212 are insulated from each other by a gate insulating film 213 interposed between the gate electrode 214 and the active layer 212.

The active layer 212 is disposed on the buffer film 211. The active layer 212 may be formed of an inorganic semiconductor (such as amorphous silicon or poly-silicon) or an organic semiconductor. In some embodiments, the active layer 212 may be formed of an oxide semiconductor. An oxide semiconductor may include an oxide formed from one or more Groups 12, 13, and 14 metal elements (such as zinc (Zn), indium (In), gallium (Ga), tin (Sn), cadmium (Cd), germanium (Ge), and hafnium (Hf)).

The gate insulating film 213 is disposed on the buffer film 211 covering the active layer 212, and the gate electrode 214 is disposed on the gate insulating film 213.

An interlayer insulating film 215 is disposed on the gate insulating film 213 covering the gate electrode 214. The source electrode 216 and the drain electrode 217 are disposed on the interlayer insulating film 215. Also, the source and drain electrodes 216 and 217 contact the active layer 212 through contact holes formed in the interlayer insulating film 215 and gate insulating film 213.

It should be noted that the TFT TR is not limited to the above-described structure, and may include other types of structure. In the embodiment of FIG. 2, the TFT TR is depicted having a top gate structure. In other embodiments, the TFT TR may have a bottom gate structure in which the gate electrode 214 is disposed beneath the active layer 212.

In some embodiments, a pixel circuit including a capacitor (not shown) may be formed along with the TFT TR.

A planarization film 218 is disposed on the interlayer insulating film 215 covering the TFT TR. The planarization film 218 serves to reduce stepped portions created by the underlying layers, and provides a planar surface on which the organic light-emitting device OLED is formed. As a result of the planar surface, the light emission efficiency of the OLED may be improved. As shown in FIG. 2, a through-hole 208 may be formed in the planarization film 218 to expose a portion of the drain electrode 217.

The planarization film 218 may be formed of an insulating material. In some embodiments, the planarization film 218 may be formed as a single layer or multi-layered structure comprising an inorganic material, an organic material, or a combination of organic/inorganic materials. In some embodiments, the planarization film 218 may include at least one of the following resins: acrylic resin, epoxy resin, phenolic resin, polyamide-based resin, polyimide-based resin, unsaturated polyester-based resin, polyphenylene-based resin, polyphenylenesulfide-based resin, and benzocyclobutene (BCB).

In some particular embodiments, the planarization film 218 and/or interlayer insulating film 215 may be omitted.

The pixel-defining layer 219 includes (and also defines) an emission region and a non-emission region. The organic light-emitting device OLED is disposed in the emission region of the pixel-defining layer 219. The organic light-emitting device OLED is disposed on the planarization film 218, and includes a first electrode 221, an organic emission layer 220, and a second electrode 222. The pixel-defining layer 219 is disposed on the first electrode 221 of the organic light-emitting device OLED, and includes an opening exposing the first electrode 221. The opening may correspond to the emission region of the pixel-defining layer 219.

An organic emission layer 220 is disposed in the emission region of the pixel-defining layer 219. As shown in FIG. 2, the organic emission layer 220 is disposed on the first electrode 221 in the opening of the pixel-defining layer 219, and may extend onto a side portion of the pixel-defining layer 219.

The pixel-defining layer 219 may be formed of an organic material (e.g., photoresist, polyacrylic resin, polyimide-based resin, or acrylic resin) or an inorganic material (e.g., a silicon compound).

In some embodiments, the organic emission layer 220 may be formed of a low-molecular-weight organic material. In those embodiments, the organic emission layer 220 may be formed as a single layer or multi-layered structure. The multi-layered structure may include a hole injection layer (HIL), a hole transport layer (HTL), an electron transport layer (ETL), an electron injection layer (EIL), and other layers stacked together with an emission layer (EML) as the center layer. The low-molecular-weight organic material may be deposited using vacuum deposition. The EML may be independently formed for each of the red, green, blue, and white pixels. The HIL, HTL, ETL, and EIL are blanket layers disposed over the substrate 21, and are therefore common to the red, green, blue, and white pixels.

In some embodiments, the organic emission layer 220 may be formed of a high-molecular-weight organic material. In those embodiments, the organic emission layer 220 may include an HTL and an EML disposed on the first electrode 221. The HTL may be formed of poly-(2,4)-ethylene-dihydroxy thiophene (PEDOT) or polyaniline (PANI) using an inkjet printing or spin coating method. Examples of a high-molecular-weight organic material include poly-phenylene vinylene (PPV)-based organic materials and polyfluorene-based organic materials. A color pattern in the organic emission layer 220 may be formed using inkjet printing, spin coating, or laser-induced thermal imaging.

The HIL may be formed of a phthalocyanine compound (such as copper phthalocyanine) or a starburst-type amine derivative (such as TCTA, m-MTDATA, or m-MTDAPB).

The HTL may be formed of N,N'-bis(3-methylphenyl)-N,N'-diphenyl[1,1-biphenyl]-4,4'-diamine (TPD) or N,N'-di(naphthalene-1-yl)-N,N'-diphenyl benzidine (α-NPD).

The EIL may be formed of LiF, NaCl, CsF, Li2O, BaO, or Liq.

The ETL may be formed of $Alq_3$.

The EML may include a host material and a dopant material.

Examples of a host material include tris(8-hydroxy-quinolinato)aluminum (Alq3), 9,10-di(naphthyl-2-yl)anthracene (AND), 3-Tert-butyl-9,10-di(naphthyl-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl(p-DMDPVBi), Tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), 1,3-bis(carbazole-9-yl)benzene (mCP), 1,3,5-tris(carbazole-9-yl)benzene (tCP), 4,4',4"-tris(carbazole-9-yl)triphenylamine (TcTa), 4,4'-bis(carbazole-9-yl)biphenyl (CBP), 4,4'-bis(9-carbazolyl)-2,2'-dimethyl-biphenyl (CBDP), 4,4'-bis(carbazole-9-yl)-9,9-dimethyl-fluorene (DMFL-CBP), 4,4'-bis(carbazole-9-yl)-9,9-bis(9-phenyl-9H-carbazole)fluorene (FL-4CBP), 4,4'-bis(carbazole-9-yl)-9,9-di-tolyl-fluorene (DPFL-CBP), or 9,9-bis(9-phenyl-9H-carbazole)fluorene (FL-2CBP).

Examples of a dopant material include 4,4-bis[4-(di-p-tolylamino)styryl]biphenyl (DPAVBi), 9,10-di-(2-naphthyl) anthracene (ADN), or 2-(t-butyl)-9,10-bis(2'-naphthyl)anthracene (TBADN).

The first electrode 221 is disposed on the planarization film 218. The first electrode 221 may be electrically connected to the drain electrode 217 of the TFT TR via the through-hole 208 in the planarization film 218.

The second electrode 222 is disposed on the organic emission layer 220, and may be disposed covering all pixels.

The first electrode 221 may function as an anode, and the second electrode 222 may function as a cathode. However, the inventive concept is not limited to the above configuration. In some embodiments, the polarities of the first electrode 221 and the second electrode 222 may be reversed, such that the first electrode 221 may function as a cathode, and the second electrode 222 may function as an anode.

When the first electrode 221 functions as an anode, the first electrode 221 may include materials having a high work function (e.g., ITO, IZO, ZnO, or $In_2O_3$). When the organic light-emitting display apparatus 100 is a top emission type (in which an image is formed away from the substrate 21), the first electrode 221 may further include a reflective film formed of a metal such as silver (Ag), magnesium (Mg), aluminum (Al), platinum (Pt), palladium (Pd), gold (Au), nickel (Ni), neodymium (Nd), iridium (Ir), chromium (Cr), lithium (Li), ytterbium (Yb), calcium (Ca), or a combination thereof. Also, the first electrode 221 may be formed as a single layer or a multi-layered structure. In some embodiments, the first electrode 221 may be a reflective electrode having an ITO/Ag/ITO structure.

When the second electrode 222 functions as a cathode, the second electrode 222 may be formed of a metal such as Ag, Mg, Al, Pt, Pd, Au, Ni, Nd, Ir, Cr, Li, Ca, or a combination thereof. When the organic light-emitting display apparatus 100 is a top emission type, the second electrode 222 has to be transparent in order to transmit light. Accordingly, in some embodiments, the second electrode 222 may include a transparent conductive metal oxide such as ITO, IZO, ZTO, ZnO, or $In_2O_3$. Alternatively, the second electrode 222 may be a thin film including at least one of the following elements or compounds: Li, Ca, LiF/Ca, LiF/Al, Al, Ag, Mg, or Yb. The second electrode 222 may be formed as a single layer or a multi-layered structure including Mg:Ag, Ag:Yb, and/or Ag.

The second electrode 222 may be formed having a configuration that allows a common voltage to be applied to all pixels.

The protruding portion 223 is disposed on a portion of the pixel-defining layer 219. The protruding portion 223 may constitute a spacer that is disposed in the non-emission region of the pixel-defining layer 219. The spacer serves to separate adjacent organic light-emitting device OLEDs. It should be noted that the protruding portion 223 is not limited to the above-described configuration. In some embodiments, the protruding portion 223 may include any structure (that is disposed on the pixel-defining layer 219) protruding above the organic light-emitting device OLED. In some embodiments, the protruding portion 223 may include foreign material (e.g. foreign particles) that is disposed on the pixel-defining layer 219 during the manufacturing process.

The protruding portion 223 may be formed of an organic material (e.g., photoresist, polyacrylic resin, polyimide-based resin, or acrylic resin) or an inorganic material (e.g., spin on glass (SOG)).

In the above-described embodiment, the organic emission layer 220 is formed in the opening of the pixel-defining layer 219 and includes light-emitting material for each independent pixel. Nevertheless, the inventive concept is not limited to the above-described configuration. In some other embodiments, the organic emission layer 220 may be formed over the entire planarization film 218 regardless of the positions of the pixels. In those other embodiments, the organic emission layer 220 may be formed, for example, by: (1) vertically stacking layers including light-emitting materials that emit red, green, and blue light; or (2) mixing light-emitting materials that emit red, green, and blue light. Different colors may be combined to produce white light. In some embodiments, the organic light-emitting display apparatus 100 may include a color conversion layer for converting the emitted white light to a particular color, or a color filter for filtering a particular color.

The thin film encapsulating layer 30 seals the organic light-emitting device OLED and the protruding portion 223. The thin film encapsulating layer 30 includes an organic film 320 and an inorganic film 310. It should be noted that the thin film encapsulating layer 30 can include a plurality of organic films 320 and inorganic films 310.

In some embodiments, the films within the organic film 320 and the inorganic film 310 may be alternately disposed (in the thin film encapsulating layer 30).

Referring to FIG. 2, the thin film encapsulating layer 30 may include a first inorganic film 301, a functional organic film 302, a second inorganic film 303, a first organic film 304, a third inorganic film 305, a second organic film 306, and a fourth inorganic film 307 that are sequentially stacked together. Accordingly, the inorganic film 310 includes the first to fourth inorganic films 301, 303, 305, and 307. The organic film 320 includes the functional organic film 302, and the first and second organic films 304 and 306.

The inorganic film 310 may be formed as a single film or stacked film including a metal oxide or metal nitride. For example, the inorganic film 310 may include at least one of the following metal oxides or nitrides: SiNx, $Al_2O_3$, $SiO_2$, $TiO_2$, SiON, ITO, AZO, ZnO, or ZrO.

As shown in FIG. 2, the fourth inorganic film 307 constitutes the uppermost layer of the thin film encapsulating layer 30 that is exposed to the ambient environment. The fourth inorganic film 307 is formed of an inorganic material, and prevents air and moisture from reaching the organic light-emitting device OLED. Nevertheless, in some other embodiments, the uppermost layer of the thin film encapsulating layer 30 (that is exposed to the ambient environment) may be formed of an organic material.

The organic film 320 may be formed as a single layer or stacked layer comprising at least one of the following polymers: polyethylene terephthalate, polyimide, polycarbonate, epoxy, polyethylene, or polyacrylate. The organic film 320 may also be formed of a high molecular monomer component including a monoacrylate-based monomer, diacrylate-based monomer, or a triacrylate-based monomer.

It should be noted that the structure of the thin film encapsulating layer 30 is not limited to the embodiment depicted in FIG. 2. In some embodiments, the thin film encapsulating layer 30 may include a structure having a plurality of sequentially stacked organic films. In other embodiments, the thin film encapsulating layer 30 may include a structure having a plurality of sequentially stacked inorganic films. In some particular embodiments, at least one of the organic films 320 and/or inorganic films 310 may be omitted from the thin film encapsulating layer 30.

The functional organic film 302 may be fully covered by the second inorganic film 303. The functional organic film 302 may be formed having a first thickness t1 near the top of the protruding portion 223.

In a conventional light-emitting display apparatus, an encapsulating layer comprising an organic film may be formed sealing a protruding portion disposed on a pixel-defining layer. However, the organic film used in the conventional light-emitting display apparatus typically has low viscosity and may expose the top of the protruding portions when the organic film spreads. To ensure that the protruding portions are covered/sealed in the conventional light-emitting display apparatus, the thickness of the thin film encapsulating layer may need to be increased. Accordingly, this may result in an increase in the thickness of the conventional organic light-emitting display apparatus (i.e., thicker form factor). Furthermore, processing time and cost of the organic film material may also increase.

The functional organic film 302 according to the inventive concept can address the above problems relating to the encapsulating layer in a conventional light-emitting display apparatus. As shown in FIG. 2, the functional organic film 302 may be formed covering the protruding portion 223, and having a thickness t1 near the top of the protruding portion 223. In some embodiments, the functional organic film 302 may have a maximum thickness of about 3 um. In particular, it should be noted that the thickness of the functional organic film 302 can vary depending on the height of the protruding portion 223.

The functional organic film 302 may be formed of a material having a viscosity that is adjustable using light or temperature. By adjusting the viscosity of the functional organic film 302, the functional organic film 302 may be formed having the first thickness t1 near the top of the protruding portion 223.

The first thickness t1 may be adjusted such that the second inorganic film 303 (which is formed on the functional organic film 302) does not come into direct contact with the protruding portion 223 even when a defect (e.g., a mask stab) arises during the fabrication of the second electrode 222, protective layer 225, or first inorganic film 301 on the protruding portion 223. In some embodiments, the first thickness t1 may be equal or greater than about 100 Å. For example, the first thickness t1 may have a value ranging between about 100 Å and about 500 Å. In some embodiments, the first thickness t1 may have a value that is less than or equal to a thickness of a substantially planar portion of the functional organic film 302 near the top of the protruding portion 223.

As shown in FIG. 2, the height of the upper surface of the functional organic film 302 may vary at different locations of the organic light-emitting display apparatus 100.

Referring to FIG. 2, a height h is measured from a top surface of the planarization film 218 to a first upper surface of the functional organic film 302 disposed away from the protruding portion 223. A height H is measured from the top surface of the planarization film 218 to a second upper surface of the functional organic film 302 near the top of a protruding portion 223. As shown in FIG. 2, the height h may be less than the height H, such that the top of the protruding portion 223 protrudes above the first upper surface of the functional organic film 302. In other words, the height h of the first upper surface of the functional organic film disposed away from the protruding portion is lower than the height H of the second upper surface of the functional organic film disposed near the top of the protruding portion. Accordingly, the protruding portion 223 may be covered by a functional organic film 302 having a low first thickness t1, thereby reducing the thickness of the organic light-emitting display apparatus 100.

In some embodiments, the functional organic film 302 may be formed of polyacrylate. For example, the functional organic film 302 may be formed of a high molecular monomer component including a monoacrylate-based monomer, a diacrylate-based monomer, or a triacrylate-based monomer. In the above embodiments, the functional organic film 302 is formed by lowering the temperature of the substrate 21 to increase the viscosity of the functional organic film 302. As such, the viscosity of the functional organic film 302 may be adjusted by varying the temperature of the substrate 21.

In some other embodiments, the monomer component of the functional organic film 302 may include a photo-initiator such as 2,4,6-Trimethylbenzoyl-diphenyl-phosphineoxide (TPO). When the functional organic film 302 includes a photo-initiator, a cross-linking reaction may occur when light is irradiated onto the functional organic film 302. The cross-linking reaction increases the viscosity of the functional organic film 302. The viscosity of the functional organic film 302 may be adjusted according to the wavelength or/and amount of the light irradiated.

In the embodiment of FIG. 2, the functional organic film 302 is formed as a single layer. In some embodiments (not shown), the functional organic film 302 may include a plurality of layers having different viscosities.

The protective layer 225 is interposed between the organic light-emitting device OLED and the thin film encapsulating layer 30. The protective layer 225 protects the organic light-emitting device OLED from damage during the formation of the thin film encapsulating layer 30. In some embodiments, the protective layer 225 may include a metal halide such as lithium fluoride (LiF).

FIGS. 3A through 3D are cross-sectional views illustrating an exemplary method of manufacturing the display apparatus 100 of FIG. 2.

Figure 3A:
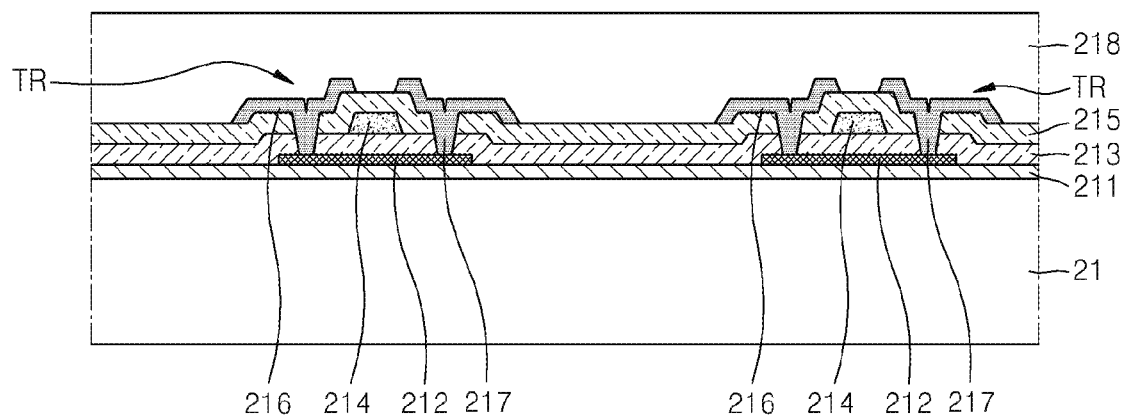
FIGS. 3A through 3D are cross-sectional views illustrating an exemplary method of manufacturing the organic light-emitting display apparatus in FIG. 2.

Referring to FIG. 3A, a buffer film 211 is formed on a substrate 21.

The buffer film 211 may be formed using various deposition methods such as PECVD, APCVD, or LPCVD. In some embodiments, a planarization process may be performed on the substrate 21 prior to forming the buffer film 211 on the substrate 21. The planarization process may include, for example, performing chemical mechanical polishing and/or etch-back of the substrate 21, so as to yield a substantially flat top surface.

Next, an active layer 212 is formed on the buffer film 211. The active layer 212 may be formed of an inorganic semiconductor (such as amorphous silicon or poly-silicon) or an organic semiconductor. In some embodiments, the active layer 212 may be formed of an oxide semiconductor. The active layer 212 may be formed using PECVD, APCVD, or LPCVD. The active layer 212 may be formed first as a blanket layer on the buffer film 211, and subsequently patterned using a mask. In some embodiments, a crystallization process (e.g. crystal growth of a seed layer to form the active layer 212) may be performed.

Next, a gate insulating film 213 is formed on the buffer film 211 covering the active layer 212. The gate insulating film 213 may be formed (having a substantially uniform thickness) on the buffer film 211 along a profile of the active layer 212.

Next, a gate electrode 214 is formed on the gate insulating film 213. Specifically, the gate electrode 214 is formed on a portion of the gate insulating film 213 (above the underlying active layer 212). The gate electrode 214 may be formed of a metal, an alloy, a metal nitride, a conductive metal oxide, or a transparent conductive material.

Next, an interlayer insulating film 215 is formed on the gate insulating film 213 covering the gate electrode 214. The interlayer insulating film 215 may be formed (having a substantially uniform thickness) on the gate insulating film 213 along a profile of the gate electrode 214. The interlayer insulating film 215 may include a silicon compound. Contact holes are etched through the interlayer insulating film 215 and the gate insulating film 213, so as to expose portions of the active layer 212.

Next, a source electrode 216 and a drain electrode 217 are formed on the interlayer insulating film 215. The source/drain electrodes 216 and 217 are spaced apart from each other by a predetermined interval with reference to the gate electrode 214, and are disposed adjacent to the gate electrode 214. The source/drain electrodes 216 and 217 are formed filling the contact holes, so as to contact both ends of the active layer 212. The source electrode 216 and the drain electrode 217 may be formed of a metal, an alloy, a metal nitride, a conductive metal oxide, or a transparent conductive material.

In some embodiments, a conductive film (not shown) may be formed on the interlayer insulating film 215 (with the conductive film filling the contact holes), and patterned to form the source/drain electrodes 216 and 217.

Next, a planarization film 218 is formed on the interlayer insulating film 215 covering the source electrode 216 and drain electrode 217. The planarization film 218 may be formed having a thickness sufficient to completely cover the source/drain electrodes 216 and 217. The planarization film 218 may be formed of an inorganic material and/or an organic material. The planarization film 218 may be formed using various methods such as spin coating, printing, sputtering, CVD, atomic layer deposition (ALD), PECVD, high density plasma-CVD (HDP-CVD), or vacuum deposition, depending on the type of material that is used to form the planarization film 218.

Figure 3B:
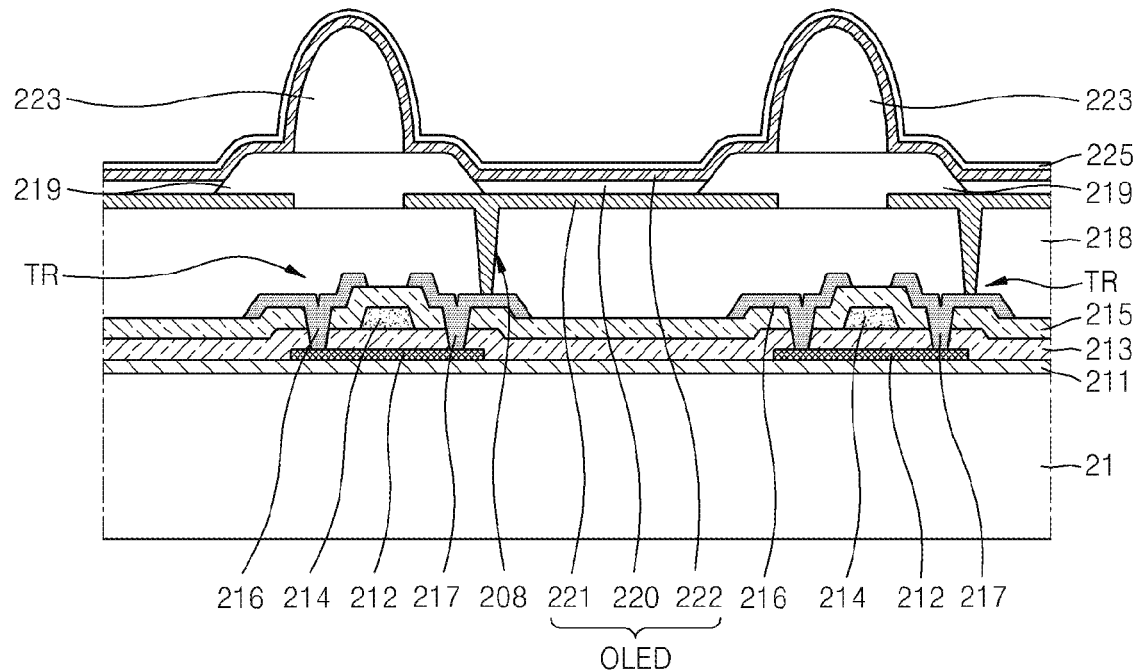

Referring to FIG. 3B, an organic light-emitting device OLED, a pixel-defining layer 219, and a protruding portion 223 are formed on the planarization film 218. As mentioned previously, the protruding portion 223 functions as a spacer separating adjacent OLEDs.

The OLED includes a first electrode 221, an organic emission layer 220, and a second electrode 19. First, a through-hole 208 is formed in the planarization film 218, so as to expose a portion of the drain electrode 217. Next, the first electrode 221 is formed on the planarization film 218, with the first electrode 221 filling the through-hole 208. The first electrode 221 is electrically connected to the drain electrode 217 of the TFT TR via the through-hole 208.

The first electrode 221 may include a reflective material. For example, the first electrode 221 may include Ag, Mg, Al, Pt, Pd, Au, Ni, Nd, Ir, Cr, Li, Yb, or Ca, or a combination thereof. Also, the first electrode 221 may be formed as a single layer or a multi-layered structure. In some embodiments, the first electrode 221 may be formed as a reflective electrode having an ITO/Ag/ITO structure.

The first electrode 221 may be formed using sputtering, vacuum deposition, CVD, pulse laser deposition, printing, or ALD. The first electrode 221 may be patterned corresponding to the pixels.

Next, to form the pixel-defining layer 219, a pre-pixel-defining layer (not shown) is formed on the planarization film 218 and the first electrode 221. The pre-pixel-defining layer may be formed using an organic material or an inorganic material. The pre-pixel-defining layer may be formed using spin coating, printing, sputtering, CVD, ALD, PECVD, HDP-CVD, or vacuum deposition, depending on the type of material that is used to form the pre-pixel-defining layer.

The pixel-defining layer 219 is formed by etching an opening in the pre-pixel-defining layer to expose a portion of the first electrode 221. As mentioned previously, the pixel-defining layer 219 defines an emission region and a non-emission region of the organic light-emitting display device 100. Specifically, the openings of the pixel-defining layer 219 correspond to the emission region, and the areas of the pixel-defining layer 219 (without openings) correspond to the non-emission region.

In some embodiments (not shown), a planarization process may be performed on the top surface of the pixel-defining layer 219. For example, a CVD and/or an etch-back process may be performed on the top surface of the pixel-defining layer 219 so as to yield a substantially flat top surface.

Next, the protruding portion 223 is formed in the non-emission region of the pixel-defining layer 219. The protruding portion 223 may be formed using an organic material or an inorganic material. The protruding portion 223 may be formed using spin coating, printing, sputtering, CVD, ALD, PECVD, HDP-CVD, or vacuum deposition, depending on the type of material that is used to form the protruding portion 223.

In some embodiments, the protruding portion 223 may be formed of a same material as the pixel-defining layer 219. In some embodiments, the protruding portion 223 and the pixel-defining layer 219 may be simultaneously formed using a half-tone mask.

Next, the organic emission layer 220 is formed in the opening of the pixel-defining layer 219. In the embodiment of FIG. 3B, the organic emission layer 220 is formed in the opening of the pixel-defining layer 219. In some other embodiments, the organic emission layer 220 may be formed on the pixel-defining layer 219 and the protruding portion 223.

The organic emission layer 220 may be formed as a single layer or a multi-layered structure. In some embodiments, the organic emission layer 220 may be formed using vacuum deposition. Alternatively, the organic emission layer 220 may be formed using inkjet printing, spin coating, or laser-induced thermal imaging.

Next, the second electrode 222 is formed on the organic emission layer 220. As shown in FIG. 3B, the second electrode 222 may also be formed on the pixel-defining layer 219 and the protruding portion 223.

The second electrode 222 may be formed of a transparent conductive material. In some embodiments, the second electrode 222 may include a transparent conductive metal oxide such as ITO, IZO, ZTO, ZnO, or $In_2O_3$. Alternatively, the second electrode 222 may be formed of a thin film including at least one of the following elements or compounds: Li, Ca, LiF/Ca, LiF/Al, Al, Ag, Mg, or Yb. Also, the second electrode 222 may be formed as a single layer or a multi-layered structure including Mg:Ag, Ag:Yb, and/or Ag.

The second electrode 222 may be formed using sputtering, vacuum deposition, CVD, pulse laser deposition, printing, or ALD. In some embodiments, the second electrode 222 may be formed having a configuration that allows a common voltage to be applied to all pixels.

Next, a protective layer 225 may be formed on the second electrode 222. The protective layer 225 may include a metal halide. The protective layer 225 may be deposited using thermal evaporation, PECVD, APCVD, or LPCVD. The protective layer 225 may include different materials. For example, in some embodiments, a lower portion of the protective layer 225 may include organic and inorganic materials. In some embodiments, the protective layer 225 may include LiF.

Figure 3C:
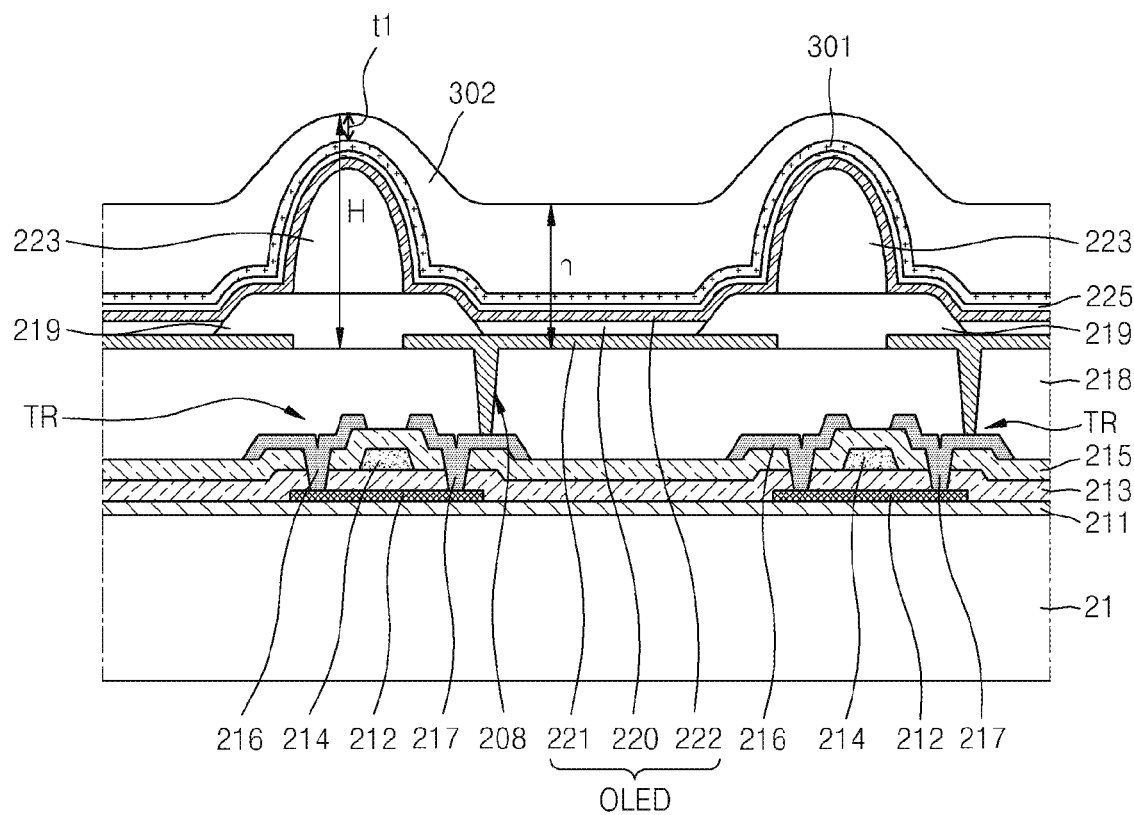

Referring to FIG. 3C, a first inorganic film 301 and a functional organic film 302 are formed over the structure of FIG. 3B. The first inorganic film 301 and the functional organic film 302 serve to encapsulate the organic light-emitting device OLED.

The first inorganic film 301 may be formed as a single layer or a multi-layered structure. The first inorganic film 301 may include at least one of the following oxides: AlOx, SiNx, SiOx, SiON, ITO, AZO, ZnO, or ZrO. The first inorganic film 301 may be deposited using CVD, ALD, or sputtering. In some cases, the first inorganic film 301 may be omitted.

As shown in FIG. 3C, the functional organic film 302 may be formed beneath the first inorganic film 301. In some embodiments, the functional organic film 302 may be interposed between the first inorganic film 301 and a second inorganic film 303, as described later with reference to FIG. 3D. The functional organic film 302 is formed as follows.

First, a liquid pre-functional organic film (not shown) is coated or deposited on the first inorganic film 301. In those embodiments in which the first inorganic film 301 is omitted, the pre-functional organic film may be coated or deposited on the organic light-emitting device (OLED). The pre-functional organic film may be coated or deposited using flash evaporation, inkjet printing, slot die coating, or other similar techniques.

The functional organic film 302 may be formed of polyacrylate. For example, the functional organic film 302 may include a high molecular monomer component comprising a monoacrylate-based monomer, diacrylate-based monomer, or a triacrylate-based monomer. In some embodiments, the monomer component of the functional organic film 302 may further include a photo-initiator such as 2,4,6-Trimethylbenzoyl-diphenyl-phosphineoxide (TPO).

The viscosity of the pre-functional organic film may be adjusted to prevent leveling of the thickness of the pre-functional organic film. The leveling is undesirable because it may increase the thickness of the organic film required to cover the protruding portion 223. The viscosity of the pre-functional organic film may be adjusted by lowering the temperature of the substrate 21.

The temperature of the substrate 21 may be lowered by flowing a cooling water or cooling liquid onto a stage on which the substrate 21 is placed, or by using a peltier device. In some embodiments, the viscosity of the pre-functional organic film may be adjusted by irradiating light onto the pre-functional organic film.

When the temperature of the substrate 21 is lowered, the viscosity of the pre-functional organic film increases and thus the spreadability of the pre-functional organic film decreases. Thus, the pre-functional organic film remains on the upper surface of the protruding portion 223. In addition, the pre-functional organic film hardens in this state, thereby forming the functional organic film 302 (having the first thickness t1) on the upper surface of the protruding portion 223. The temperature of the substrate 21 and the length of time that is required to harden the pre-functional organic film may be determined based on the desired viscosity of the pre-functional organic film. Accordingly, by adjusting the viscosity of the pre-functional organic film, a liquid pre-functional organic film having a predetermined thickness may be formed (as the functional organic film 302) on the upper surface of the protruding portion 223.

When the pre-functional organic film includes a photo-initiator, the viscosity of the pre-functional organic film may be adjusted by irradiating light onto the pre-functional organic film. When light is irradiated onto the pre-functional organic film, a cross-linking reaction may occur, which increases the viscosity of the pre-functional organic film. Subsequently, the pre-functional organic film hardens, thereby forming the functional organic film 302 (having the first thickness t1) on the upper surface of the protruding portion 223. The viscosity of the pre-functional organic film may be adjusted based on the wavelength and/or intensity of the irradiated light.

Figure 3D:
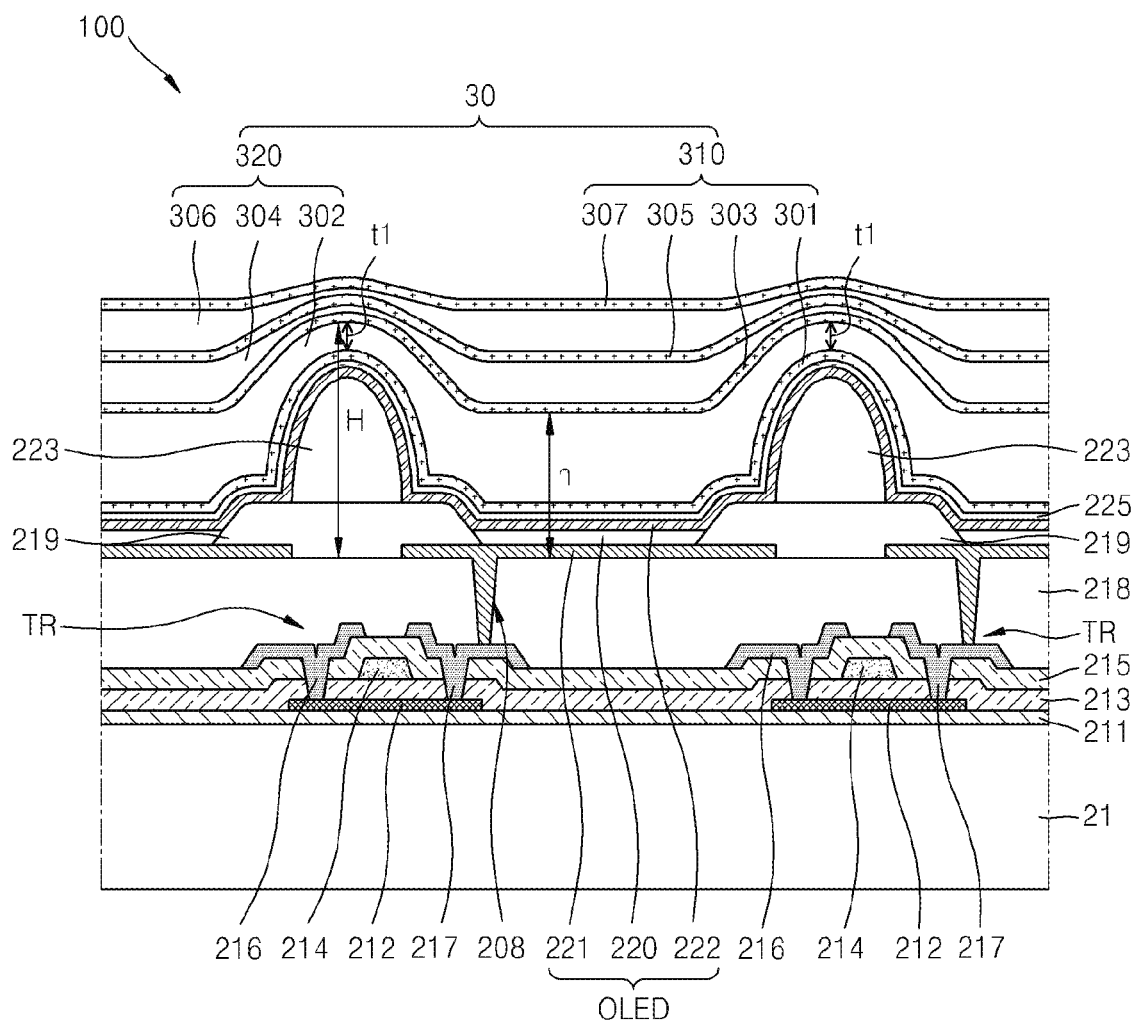

Referring to FIG. 3D, a thin film encapsulating layer 30 is formed over the structure of FIG. 3C. The thin film encapsulating layer 30 includes an organic film 320 and an inorganic film 310. It should be noted that the thin film encapsulating layer 30 can include a plurality of organic films 320 and inorganic films 310. The thin film encapsulating layer 30 is formed by alternately stacking second, third, and fourth inorganic film 303, 305, and 307, and first and second organic film 304 and 306 on the functional organic film 302.

Each of the second, third, and fourth inorganic films 303, 305, and 307 may be formed as a single layer or multi-layered structure. Each of the inorganic films 303, 305, and 307 may include at least one of the following oxides: AlOx, SiNx, SiOx, SiON, ITO, AZO, ZnO, or ZrO. The inorganic films 303, 305, and 307 may be deposited using CVD, ALD, sputtering, or other similar techniques.

Each of the first and second organic films 304 and 306 may be formed as a single layer or a multi-layered structure. Each of the organic films 304 and 306 may include at least one of epoxy, acrylate, silicon, and polyacrylate. The first and second organic films 304 and 306 may be coated or deposited using flash evaporation, inkjet printing, slot die coating, or other similar techniques.

As shown in FIG. 3D, the fourth inorganic film 307 constitutes the uppermost layer of the thin film encapsulating layer 30 that is exposed to the ambient environment. The fourth inorganic film 307 prevents air and moisture from reaching the organic light-emitting device OLED. Accordingly, the organic light-emitting device OLED is effectively sealed by the thin film encapsulating layer 30.

In the embodiment of FIG. 3D, the fourth inorganic film 307 is formed of an inorganic material. Nevertheless, in some other embodiments, the uppermost layer of the thin film encapsulating layer 30 (that is exposed to the ambient environment) may be formed of an organic material.

Figure 4:
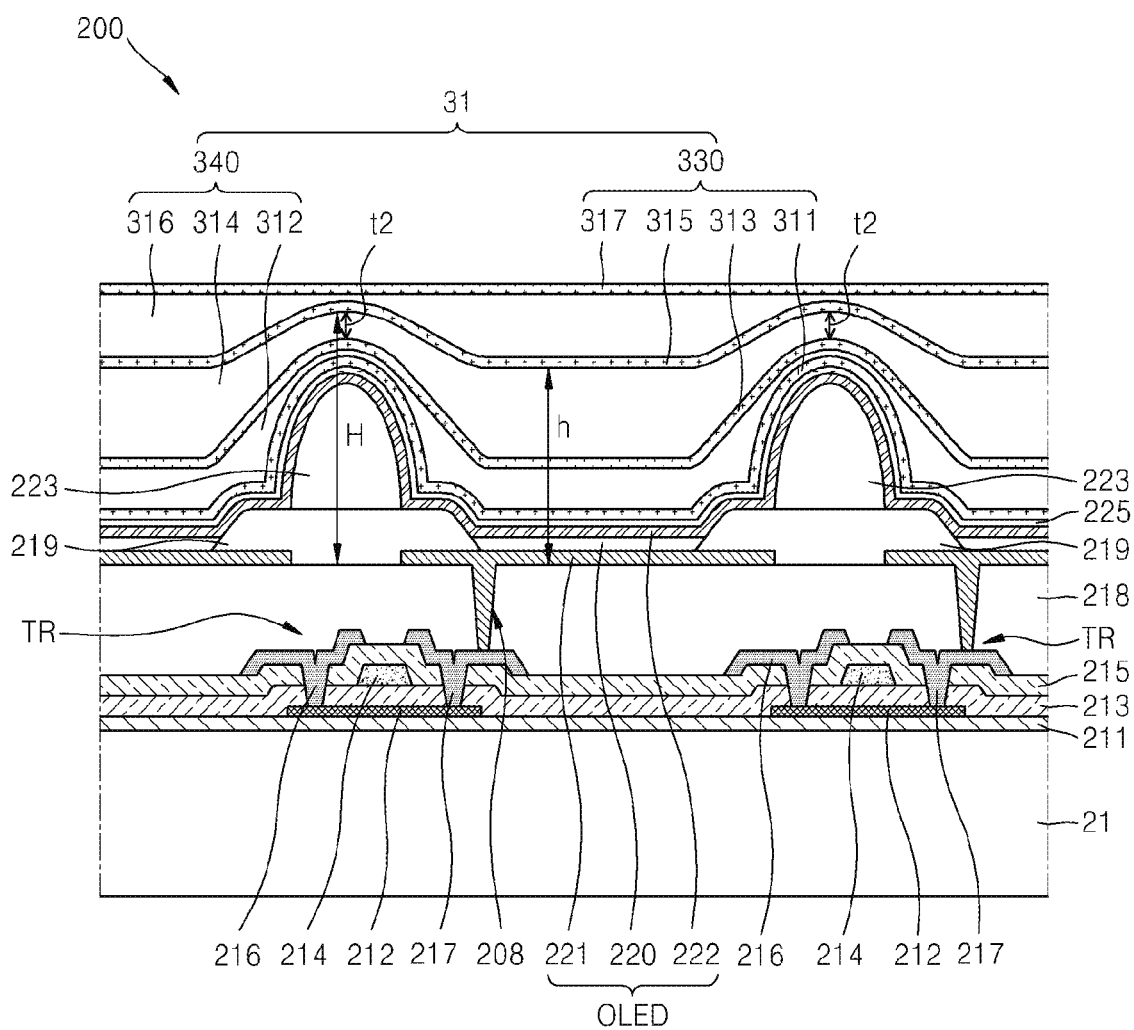
FIG. 4 is a cross-sectional view of an organic light-emitting display apparatus according to another embodiment of the inventive concept.

FIG. 4 is a cross-sectional view of an organic light-emitting display apparatus according to another embodiment of the inventive concept. The embodiment in FIG. 4 includes elements similar to those described in FIG. 2, and thus description of those similar elements shall be omitted.

Referring to FIG. 4, the organic light-emitting display apparatus 200 includes a thin film encapsulating layer 31. The thin film encapsulating layer 31 includes an inorganic film 330 and an organic film 340. The inorganic film 330 and the organic film 340 of FIG. 4 may be formed using the same materials and methods as the inorganic film 310 and the organic film 320 of FIG. 2. The inorganic film 330 includes a first inorganic film 311, a second inorganic film 313, a third inorganic film 315, and a fourth inorganic film 317. The organic film 340 includes a first organic film 312, a functional organic film 314, and a second organic film 316. As shown in FIG. 4, the films in the inorganic film 330 and the organic film 340 are sequentially stacked together.

The first inorganic film 311, the first organic film 312, and the second inorganic film 313 are disposed beneath the functional organic film 314. Referring to FIG. 4, a height h is measured from a top surface of a planarization film 218 to a first upper surface of the functional organic film 314 disposed away from a protruding portion 223. A height H is measured from the top surface of the planarization film 218 to a second upper surface of the functional organic film 314 above the top of a protruding portion 223. The functional organic film 314 is formed having a second thickness t2 above the top of the protruding portion 223.

As shown in FIG. 4, the height h may be less than the height H. In other words, the height h of the first upper surface of the functional organic film 314 disposed away from the protruding portion 223 is lower than the height H of the second upper surface of the functional organic film 314 disposed above the top of the protruding portion However, the difference between the heights h and H in the embodiment of FIG. 4 is less than that of FIG. 2. Referring back to FIG. 2, the top of the protruding portion 223 protrudes above the first upper surface of the functional organic film 302. In contrast to FIG. 2, the top of the protruding portion 223 in FIG. 4 is disposed below the first upper surface of the functional organic film 314. Nevertheless, the protruding portion 223 in FIG. 4 remains covered by the functional organic film 314, similar to FIG. 2.

Referring to FIG. 4, the second thickness t2 may be adjusted such that the third inorganic film 315 (which is formed on the functional organic film 314) does not come into contact with the second inorganic film 313, even when a defect (e.g., a mask stab) occurs during fabrication of the functional organic film 314. In some embodiments, the second thickness t2 may be equal to or greater than about 100 Å. For example, the second thickness t2 may have a value ranging between about 100 Å and about 500 Å. In some embodiments, the second thickness t2 may have a value that is equal to or less than a thickness of a substantially planar portion of the functional organic film 314 above the top of the protruding portion 223. Also, the second thickness t2 may vary depending on the number (of) and thicknesses of the films in the thin film encapsulating layer 31, as well as the height of the protruding portion 223.

Referring to FIG. 4, the second organic film 316 constitutes the uppermost organic film of the organic light-emitting display apparatus 200. A planarization process may be performed on the second organic film 316 so as to yield a substantially planar surface.

In the embodiments of FIGS. 2 and 4, the thin film encapsulating layer 31 includes a single functional organic film. Nevertheless, it should be noted that in some embodiments, the thin film encapsulating layer 31 may include a plurality of functional organic films.

Figure 5:
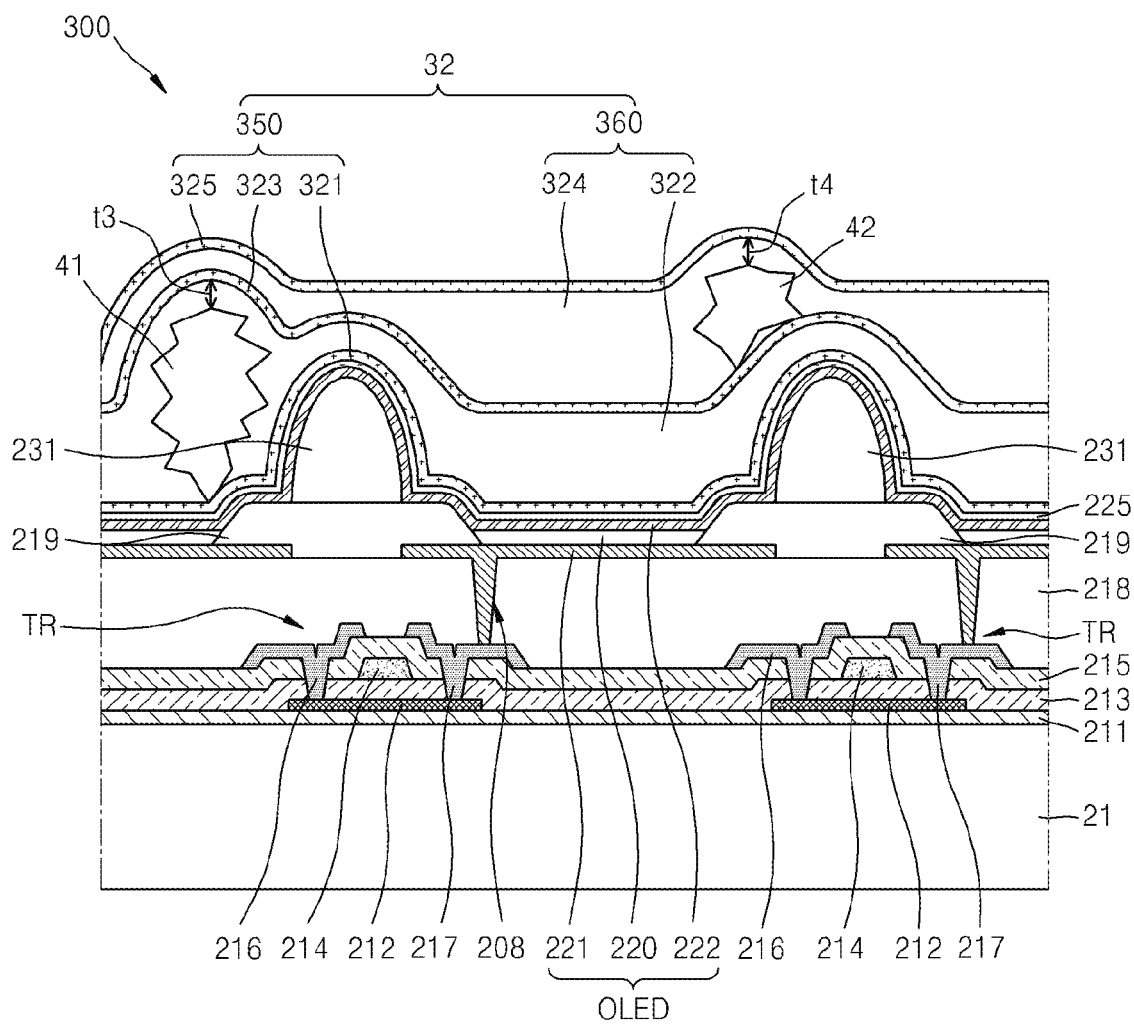
FIG. 5 is a cross-sectional view of an organic light-emitting display apparatus according to a further embodiment of the inventive concept.

FIG. 5 is a cross-sectional view of an organic light-emitting display apparatus according to a further embodiment of the inventive concept. The embodiment in FIG. 5 includes elements similar to those described in FIG. 2, and thus description of those similar elements shall be omitted.

Referring to FIG. 5, the organic light-emitting display apparatus 300 includes a thin film encapsulating layer 32. The thin film encapsulating layer 32 includes an inorganic film 350 and a functional organic film 360. The thin film encapsulating layer 32 also includes foreign particles 41 and 42. The inorganic film 350 and the organic film 360 of FIG. 5 may be formed using the same materials and methods as the inorganic film 310 and the organic film 320 of FIG. 2. The inorganic film 350 includes a first inorganic film 321, a second inorganic film 323, and a third inorganic film 325. The functional organic film 360 includes a first functional organic film 322 and a second functional organic film 324. As shown in FIG. 5, the films in the inorganic film 350 and the organic film 360 are sequentially stacked together, with the foreign particles 41 and 42 interposed between adjacent films. It should be noted that in some embodiments, more particles can be encapsulated by having more than one functional organic film.

The organic light emitting display apparatus 300 also includes a spacer 231 having the same function as the protruding portion 223 of FIG. 2. The spacer 231 may be formed using the same materials and methods as the protruding portion 223 of FIG. 2.

In the embodiment of FIG. 5, the protruding portions include the foreign particles 41 and 42, and the spacer 231. As shown in FIG. 5, the foreign particles 41 and 42 may protrude above the spacer 231.

The first functional organic film 322 may be formed having a third thickness t3 above an upper surface of the foreign particle 41.

The second functional organic film 324 may be formed having a fourth thickness t4 above an upper surface of the foreign particle 42.

The third thickness t3 and the fourth thickness t4 may be different from each other, and may be adjusted by adjusting the respective viscosities of the first functional organic film 322 and the second functional organic film 324. Similar to the embodiments in FIGS. 2 and 4, the first functional organic film 322 and the second functional organic film 324 in FIG. 5 may be formed of materials having viscosities that are adjustable using light or temperature.

Thus, although the organic light-emitting display apparatus 300 may include the foreign particles 41 and 42, the foreign particles 41 and 42 are nonetheless covered by the first functional organic film 322 and the second functional organic film 324. Accordingly, the organic light emitting device OLED in FIG. 5 remains effectively sealed by the thin film encapsulating layer 32.

The thin film encapsulating layer 32 of FIG. 5 may be modified in different ways. For example, in some embodiments, the thin film encapsulating layer 32 may have a structure in which only the first functional organic film 322 and the second inorganic film 323 are stacked together. In some other embodiments, the thin film encapsulating layer 32 may further include an additional organic film and/or an additional inorganic film interposed between the films.

It should be understood that the embodiments described above are to be considered in a descriptive sense, and should not be construed as limiting the inventive concept. Descriptions of features or aspects within each embodiment are generally applicable to similar features or aspects in other embodiments.

While one or more embodiments of the inventive concept have been described, it will be understood by those of ordinary skill in the art that various changes may be made to the embodiments without departing from the spirit and scope of the present disclosure.

What is claimed is:

1. An organic light-emitting diode (OLED) display, comprising:
   a substrate;
   a thin film transistor (TFT) over the substrate;
   an insulating layer over the TFT;
   a pixel-defining layer over the insulating layer;
   a first electrode between the insulating layer and the pixel-defining layer, wherein the pixel-defining layer comprises an opening overlapping the first electrode;
   an organic emission layer over the first electrode;
   a second electrode on the organic emission layer;
   a protruding portion over the pixel-defining layer; and
   a thin film encapsulating layer covering the protruding portion and the second electrode, the thin film encapsulating layer comprising at least one inorganic encapsulating layer and at least one organic encapsulating layer,
   wherein the at least one organic encapsulating layer covers a first region in which the insulating layer, the pixel-defining layer, and the protruding portion overlapping each other, and a second region corresponding to a center region of the first electrode, a first height from the insulating layer to an upper surface of the at least one organic encapsulating layer in the first region is greater than a second height from the insulating layer to the upper surface of the at least one organic encapsulating layer in the second region, and wherein the at least one organic encapsulating layer comprising a first portion corresponding to the first region and a second portion corresponding to the second region, a first thickness of the first portion being less than a second thickness of the second portion.

2. The OLED display of claim 1, wherein the thin film encapsulating layer comprises an organic encapsulation layer directly below an uppermost inorganic encapsulation layer of the thin film encapsulating layer, the organic encapsulation layer has a substantially flat upper surface.

3. The OLED display of claim 2, wherein the thin film encapsulating layer comprises a lower inorganic encapsulation layer below the organic encapsulation layer.

4. The OLED display of claim 1, wherein the protruding portion comprises a spacer.

5. The OLED display of claim 4, the spacer directly on and contact the upper surface of the pixel-defining layer.

6. The OLED display of claim 5, wherein each of the pixel-defining layer and the spacer comprises an organic material.

7. The OLED display of claim 4, wherein the second electrode covers the protruding portion.

8. The OLED display of claim 4, further comprising a LiF layer between the second electrode and the thin film encapsulating layer.

9. The OLED display of claim 1, wherein the protruding portion comprises foreign material.

10. The OLED display of claim 1, wherein the at least one organic encapsulating layer comprises a material having a viscosity that is adjustable by light or temperature.

11. An organic light-emitting diode (OLED) display, comprising:
a thin film transistor (TFT);
an insulating layer on the TFT;
an OLED including a first electrode electrically connected to the TFT via a contact hole of the insulating layer, an organic emission layer on the first electrode, and a second electrode on the organic emission layer;
a pixel-defining layer on the first electrode, the pixel-defining layer comprising an opening corresponding to the first electrode;
a protruding portion on the pixel-defining layer; and
a film encapsulating layer on the OLED and the protruding portion, the film encapsulating layer comprising at least one inorganic encapsulation layer and at least one organic encapsulation layer,
wherein the at least one organic encapsulation layer comprising:
a first portion corresponding to a first region in which the insulating layer, the pixel-defining layer, and the protruding portion overlapping each other; and
a second portion corresponding to a second region corresponding to a center region of the first electrode, wherein a thickness of the first portion is less than that of the second portion.

12. The OLED display of claim 11, wherein a first height from the insulating layer to an upper surface of the first portion is greater than a second height from the insulating layer to an upper surface of the second portion.

13. The OLED display of claim 11, wherein a lowermost layer of the film encapsulating layer comprises an inorganic encapsulation layer facing the second electrode.

14. The OLED display of claim 13, further comprising a protective layer between the second electrode and the film encapsulating layer.

15. The OLED display of claim 14, wherein the protective layer comprises lithium fluoride (LiF).

16. The OLED display of claim 11, wherein the protruding portion comprises a spacer.

17. The OLED display of claim 16, wherein the spacer comprises an organic material.

18. The OLED display of claim 11, wherein the protruding portion comprises foreign material.

* * * * *